United States Patent
Ukai et al.

(10) Patent No.: US 11,654,843 B2
(45) Date of Patent: May 23, 2023

(54) ELECTRONIC CONTROL COMPONENT BRACKET

(71) Applicants: DAIWA KASEI INDUSTRY CO., LTD., Okazaki (JP); TOYOTA JIDOSHA KABUSHIKI KAISHA, Toyota (JP)

(72) Inventors: Junya Ukai, Okazaki (JP); Makoto Kato, Okazaki (JP); Kazunori Takata, Toyota (JP)

(73) Assignees: DAIWA KASEI INDUSTRY CO., LTD., Okazaki (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/701,962

(22) Filed: Dec. 3, 2019

(65) Prior Publication Data

US 2020/0198560 A1 Jun. 25, 2020

(30) Foreign Application Priority Data

Dec. 20, 2018 (JP) .............................. JP2018-238092

(51) Int. Cl.
*B60R 16/023* (2006.01)
*F16B 2/22* (2006.01)

(52) U.S. Cl.
CPC ............ *B60R 16/0231* (2013.01); *F16B 2/22* (2013.01)

(58) Field of Classification Search
CPC ........ Y10T 24/44017; Y10T 24/44026; B65D 25/101; B65D 25/102; B65D 25/103;
(Continued)

(56) References Cited

U.S. PATENT DOCUMENTS 1,181,173 A * 5/1916 Schubert ................ G01D 11/26
                                                    220/664
2,873,082 A * 2/1959 Gillespie ................. F16B 2/241
                                                    248/300
(Continued)

FOREIGN PATENT DOCUMENTS

CN        202301737 U       7/2012
DE        29706022 U1 *    5/1997      ........... B26B 21/225
(Continued)

OTHER PUBLICATIONS

Indian Office Action dated Feb. 16, 2022, issued in application No. IN 201934047939.
(Continued)

*Primary Examiner* — Kimberly T Wood
(74) *Attorney, Agent, or Firm* — McClure, Qualey & Rodack, LLP

(57) ABSTRACT

An object is to provide an electronic control component bracket that is less likely to cause a high acceleration (high-speed vibration). An electronic control component bracket 1 includes a bottom portion on which a plurality of elastic pieces configured to press a lower surface of an electronic control component upward are provided, and abutting stop portions configured to abut, from above, against the electronic control component that is pressed upward. The plurality of elastic pieces are provided such that, when vertical vibration is applied in a state in which the electronic control component is assembled, the amplitude of at least one elastic piece is larger than that of another elastic piece.

4 Claims, 8 Drawing Sheets

(58) Field of Classification Search
CPC ... B65D 25/10; F16B 2/24; F16B 2/20; F16B 2/22; B60R 16/0231; F16F 15/04; F16F 15/046; F16F 2222/08; F16F 2228/00; F16F 2230/0005; H05K 5/0073; H05K 5/0056
USPC .............. 248/27.3, 649, 154, 222.12, 316.2, 248/221.11, 222.11, 222.13, 693, 550, 248/316.1, 316.7, 346.04, 310, 74.2, 56, 248/674, 300, 71, 65, 73, 74.1, 75, 592, 248/294, 595, 607, 619, 638, 225.21, 305, 248/309.1, 671, 176.1; 206/722, 701, 206/723, 724, 477, 480, 482
See application file for complete search history.

(56) References Cited

U.S. PATENT DOCUMENTS

| | | | | |
|---|---|---|---|---|
| 3,058,714 A * | 10/1962 | Oliver | | H01C 1/014 248/300 |
| 3,160,280 A * | 12/1964 | Burch | | H02B 1/052 211/89.01 |
| 3,595,402 A * | 7/1971 | Smaczny | | H01R 9/26 211/26 |
| 3,917,202 A * | 11/1975 | Reinwall, Jr. | | H01R 9/26 248/68.1 |
| 4,273,399 A * | 6/1981 | Myers | | H03H 9/09 439/74 |
| 5,271,587 A * | 12/1993 | Schaty | | H02G 3/26 248/68.1 |
| 5,865,413 A * | 2/1999 | Niemann | | H05K 3/301 248/314 |
| 5,901,049 A * | 5/1999 | Schmidt | | G06K 7/0034 361/787 |
| 6,082,547 A * | 7/2000 | Nentl | | H01L 21/67333 206/724 |
| 6,371,419 B1 * | 4/2002 | Ohnuki | | F16L 3/13 248/71 |
| 6,565,049 B2 * | 5/2003 | Hahn | | B60R 16/0215 248/68.1 |
| 6,651,827 B1 * | 11/2003 | Eberwein | | A47F 1/126 206/215 |
| 6,820,753 B2 * | 11/2004 | Kurtz | | A47K 10/20 211/49.1 |
| 6,883,762 B2 * | 4/2005 | Miura | | B60R 16/0215 248/62 |
| 7,328,873 B2 * | 2/2008 | Suzuki | | F16L 55/035 248/55 |
| 7,533,852 B2 * | 5/2009 | Stigler | | F16L 3/223 24/555 |
| 7,575,203 B2 * | 8/2009 | Lan | | G06F 1/187 248/220.21 |
| 7,856,746 B1 * | 12/2010 | Araujo | | G09F 3/0295 40/316 |
| 7,938,376 B2 * | 5/2011 | Jimenez | | B60R 11/00 248/316.7 |
| 8,408,501 B2 * | 4/2013 | Noyes | | B60D 1/62 248/75 |
| 8,857,613 B1 * | 10/2014 | Harris | | B65D 73/0021 206/482 |
| 9,370,131 B2 * | 6/2016 | Konda | | H05K 9/0022 |
| 2001/0054671 A1 * | 12/2001 | Kondo | | F16L 3/1025 248/74.3 |
| 2005/0067538 A1 * | 3/2005 | Stigler | | F16L 3/1008 248/65 |
| 2005/0146023 A1 * | 7/2005 | Edwards | | H01L 23/4093 257/707 |
| 2006/0231686 A1 * | 10/2006 | Lin | | G11B 33/124 248/27.1 |
| 2009/0308987 A1 * | 12/2009 | Martha Exposito | | H02G 3/32 248/70 |
| 2015/0122957 A1 * | 5/2015 | Michiels | | F16L 3/13 248/74.2 |
| 2015/0377387 A1 * | 12/2015 | Meyers | | B60R 16/0215 248/74.2 |

FOREIGN PATENT DOCUMENTS

| | | | | |
|---|---|---|---|---|
| EP | 0407239 A1 * | 1/1991 | ............ | F16L 3/2235 |
| JP | 2006-220171 A | 8/2006 | | |
| JP | 2007-056908 A | 3/2007 | | |
| JP | 2008-117840 A | 5/2008 | | |
| JP | 2009-267459 A | 11/2009 | | |
| JP | 2010-035011 A | 2/2010 | | |

OTHER PUBLICATIONS

Japanese language office action dated Aug. 2, 2022, issued in application No. JP JP2018-238092.

English language translation of office action dated Aug. 2, 2022, issued in application No. JP JP2018-238092.

* cited by examiner

ELECTRONIC CONTROL COMPONENT BRACKET

RELATED APPLICATIONS

This application claims the priority of Japanese Patent Application No. 2018-238092 filed on Dec. 20, 2018. The disclosure of the prior application is hereby incorporated herein in the entirety by reference.

BACKGROUND OF THE INVENTION

Field of the Invention

This invention relates to an electronic control component bracket for assembling an electronic control component such as an ECU to a vehicle body side.

Description of Related Art

For example, an ECU (Electronic Control Unit) of a vehicle contains a circuit board inside a casing (ECU case), and is attached to a panel member on the vehicle body side by using a bracket (Japanese Laid-Open Patent Publication No. 2006-220171).

Such a bracket absorbs traveling vibration of the vehicle by utilizing pressing with elastic pieces, and functions to suppress the acceleration (vibration frequency) applied to the ECU by the traveling vibration. This makes it possible to prevent a contact failure of a connector of the electronic control component. However, even in such a situation where the acceleration (vibration frequency) is suppressed, there is a possibility that the acceleration may be increased in a specific frequency band.

An object of this invention is to provide an electronic control component bracket that is less likely to cause a high acceleration (high-speed vibration).

SUMMARY OF THE INVENTION

In order to solve the above-described problem, an electronic control component bracket according to this invention is an electronic control component bracket for assembling an electronic control component to a vehicle body side, the electronic control component bracket including:

a bottom portion that is to be disposed on a lower surface side of the electronic control component, and on which a plurality of elastic pieces configured to press the lower surface upward are provided; and abutting stop portions configured to abut, from above, against the electronic control component that is pressed upward, wherein, when vibration is applied in an assembled state in which the electronic control component is clamped between the elastic pieces and the abutting stop portions, one or both of an amplitude and a vibration period, in a vertical direction, of one elastic piece are set to be different from those of at least another elastic piece.

It is noted that, in the electronic control component of this invention, the side that is pressed to the elastic pieces when the electronic control component bracket is assembled is defined as the lower surface side (lower side), and the side that is abutted and stopped by the abutting stop portion is defined as the upper side.

According to a conventional configuration, a plurality of elastic pieces are provided as stabilizers on the electronic control component bracket in order to reduce the acceleration (vibration) of the electronic control component, and the elastic pieces hold the electronic control component in a pressing state. However, those elastic pieces all have the same shape and the same pressing reaction force, and press the electronic control component in a well-balanced manner. This good balance, in fact, leads to the matching of the frequency bands in which the acceleration (vibration frequency) is increased in the individual elastic pieces, resulting in a further increased acceleration in the matching frequency band. According to the above-described configuration of this invention, the amplitude and the vibration period of at least one of the plurality of elastic pieces are set to be different from those of the other elastic pieces. That is, the supports for the electronic control component provided by the plurality of elastic pieces are intentionally made imbalanced. Accordingly, the acceleration will not be increased in a specific frequency band in such a form that the individual elastic pieces resonate. That is, the acceleration peaks in the individual elastic pieces are dispersed, whereby the peak can be lowered.

The above-described plurality of elastic pieces of this invention may be provided such that at least one elastic piece has a larger pressing reaction force for pressing the lower surface than another elastic piece. With this configuration, the frequency bands in which the acceleration is increased in the individual elastic pieces are dispersed, so that an extremely large acceleration will not be generated in a specific frequency band. Specifically, the above-described plurality of elastic pieces of this invention are provided such that one or more of a plate thickness, a plate width, a plate length, and a shape of at least one elastic piece are different from those of other elastic pieces, whereby the elastic pieces can have different pressing reaction forces.

In the above-described plurality of elastic pieces of this invention, pressing positions of the plurality of elastic pieces at which the elastic pieces press the lower surface may be dispersed so as not to have rotational symmetry and line symmetry within the lower surface. In the case of the conventional configuration, in addition to having the same shape and the same pressing reaction force, the plurality of elastic pieces are disposed so as to have symmetry. Therefore, there is a possibility that an extremely large acceleration may be generated in a specific frequency band. According to the above-described configuration, no symmetry occurs in the arrangement of the plurality of elastic pieces, and, therefore, the frequency bands in which the acceleration is increased in the individual elastic pieces can be dispersed.

DESCRIPTION OF THE PREFERRED EMBODIMENTS

An embodiment of this invention will be described with reference to the drawings.

Figure 1:
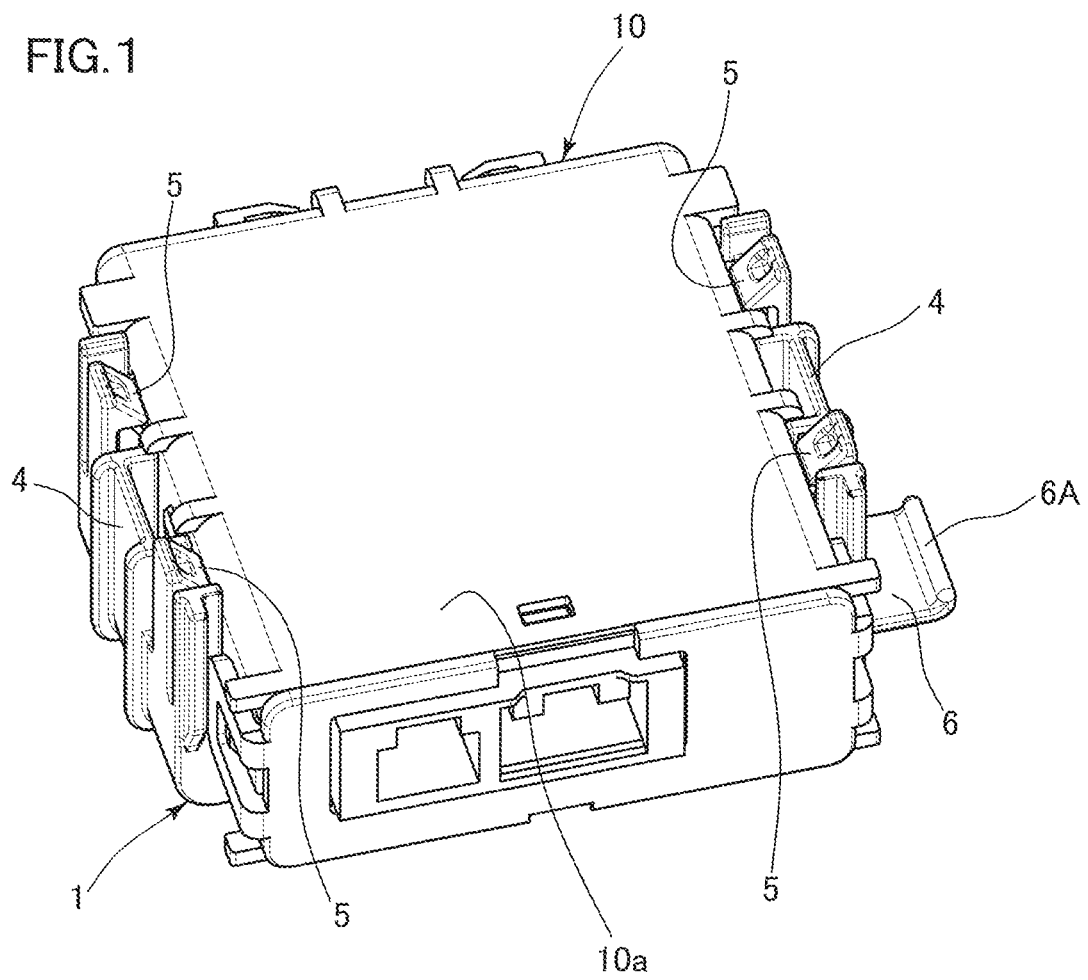
FIG. 1 is a perspective view showing a state in which an ECU is assembled to an ECU bracket according to an embodiment of this invention.
Figure 2:
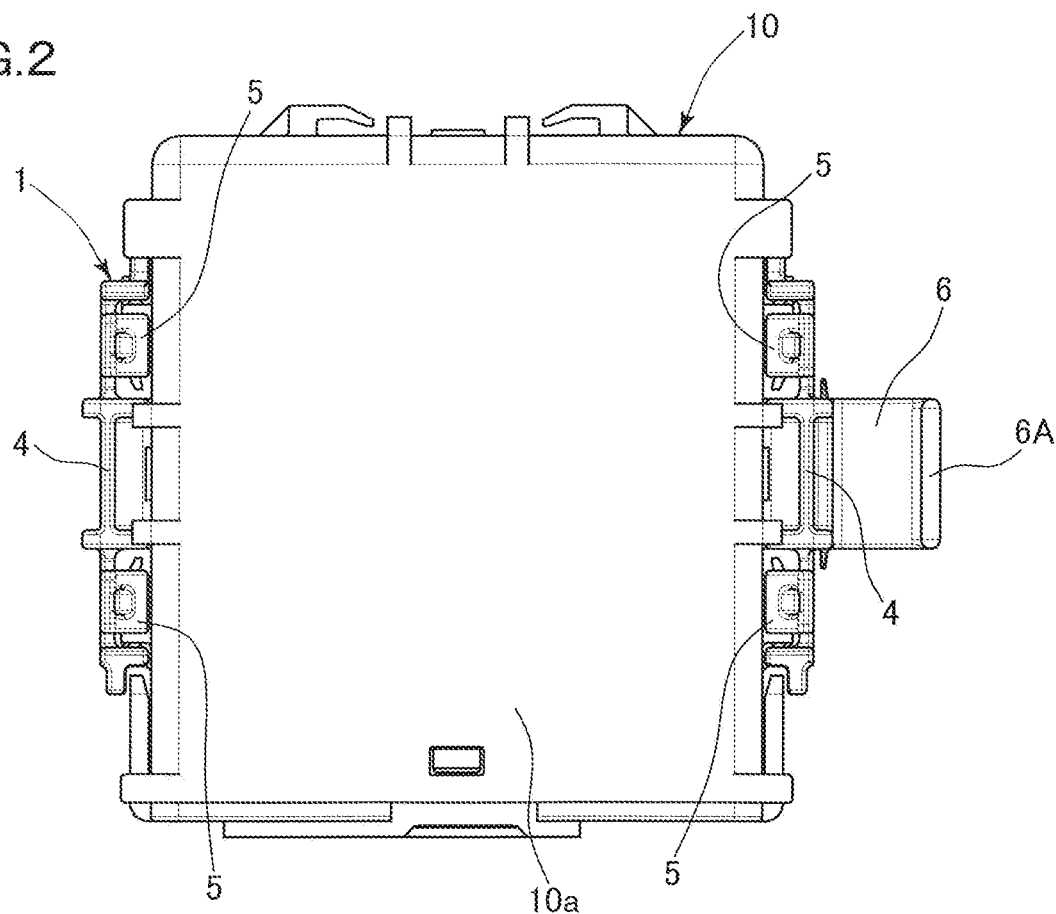
FIG. 2 is a plan view of FIG. 1.
Figure 3:
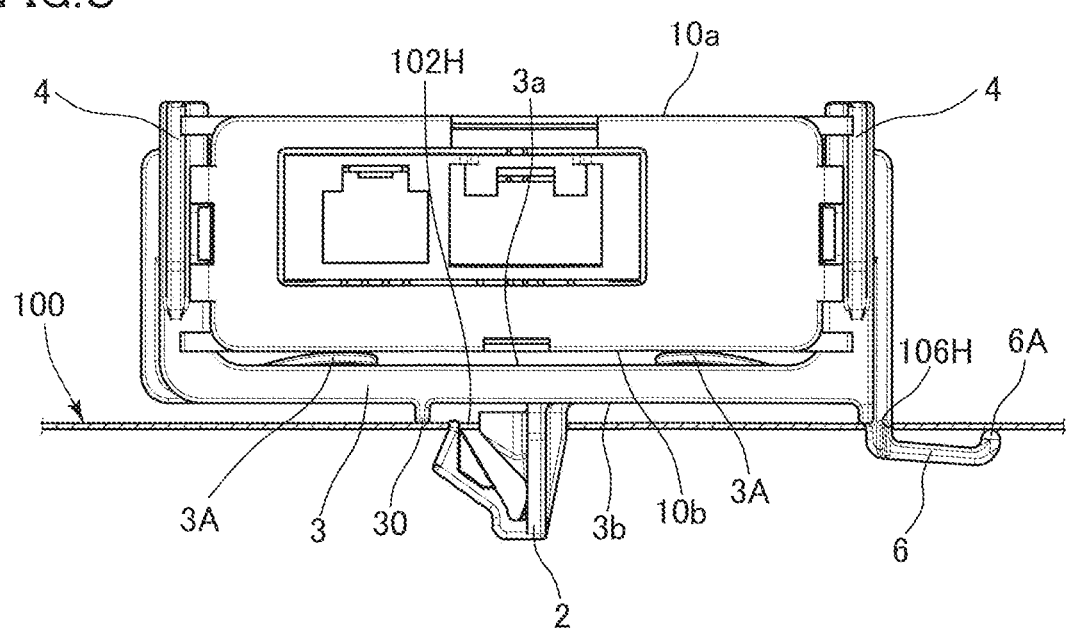
FIG. 3 is a front view of FIG. 1.

As shown in FIGS. 1 to 3, an electronic control component bracket 1 of this embodiment includes: first and second engaging portions 2, 6 (engaging portions: see FIG. 3) for assembling an electronic control component 10 to a vehicle body side; a bottom portion 3 that is to be disposed on a lower surface 10b side of the electronic control component 10 and on which a plurality of elastic pieces 3A configured to press the lower surface 10b upward are provided; side wall portions 4, 4 that stand upward so as to cover both lateral sides of the bottom portion 3; and abutting stop portions 5 that extend from upper ends of the side wall portions 4 so as to overlap to the upper surface 10a side. The electronic control component 10 is disposed on the bottom portion 3 so as to be sandwiched between the two side wall portions 4, 4 of the electronic control component bracket 1, and is brought into an assembled state in which the electronic control component 10 is clamped by being sandwiched by the elastic pieces 3A and the abutting stop portions 5.

As shown in FIG. 3, the first engaging portion 2 here is formed so as to protrude from a back surface 3b on the side, of the bottom portion 3, that is opposite to a main front surface 3a side on which the electronic control component 10 is disposed. The first engaging portion 2 here is an insertion engaging portion that is to be inserted to a first fixing hole 102H of a panel member 100 on the vehicle body side, and that is to be engaged with and fixed to a peripheral portion of the fixing hole 102H so as to be latched to the peripheral portion at the inserted location. It is noted that the first engaging portion 2 is not limited to the one described in this embodiment, and may be assembled to the vehicle body side in a different shape by a different engaging method.

The second engaging portion 6 here has an arm shape extending downward from the back surface 3b of the bottom portion 3 and being bent so as to be substantially parallel to the bottom portion 3 at the extension location, and is formed as an elastic arm whose distal end side is elastically deformable in a vertical direction. The second engaging portion 6 here is a go-around engaging portion configured such that, when inserted to a second fixing hole 106H of the panel member 100 on the vehicle body side, the distal end side of the engaging portion goes around to the back side of the panel member 100, and a distal end portion 6A is latched to (comes into contact with) the back surface of the panel member 100. When the distal end portion 6A comes into contact with the back surface of the panel member 100, the second engaging portion 6 undergoes elastic deformation in a direction in which the distal end portion 6A side moves away from the back surface of the panel member 100, and the distal end portion 6A presses the panel member 100 from the back surface side to the front side.

When the first and second engaging portions 2, 6 are attached to the panel member 100, first, the second engaging portion 6 is passed through the second fixing hole 106H of the panel member 100. Thereafter, the first engaging portion 2 is passed through the first fixing hole 102H of the panel member 100. This brings about a state in which the first engaging portion 2 is inserted and latched to the first fixing hole 102H while the distal end portion 6A of the second engaging portion 6 presses the panel member 100 from the back surface side to the front side, thus bringing about a state in which the front surface of the panel member 100 abuts against an abutting portion 30 protruding downward from the bottom portion 3, or in other words, a state in which the first and second engaging portions 2, 6 are attached to the panel member 100.

Figure 4:
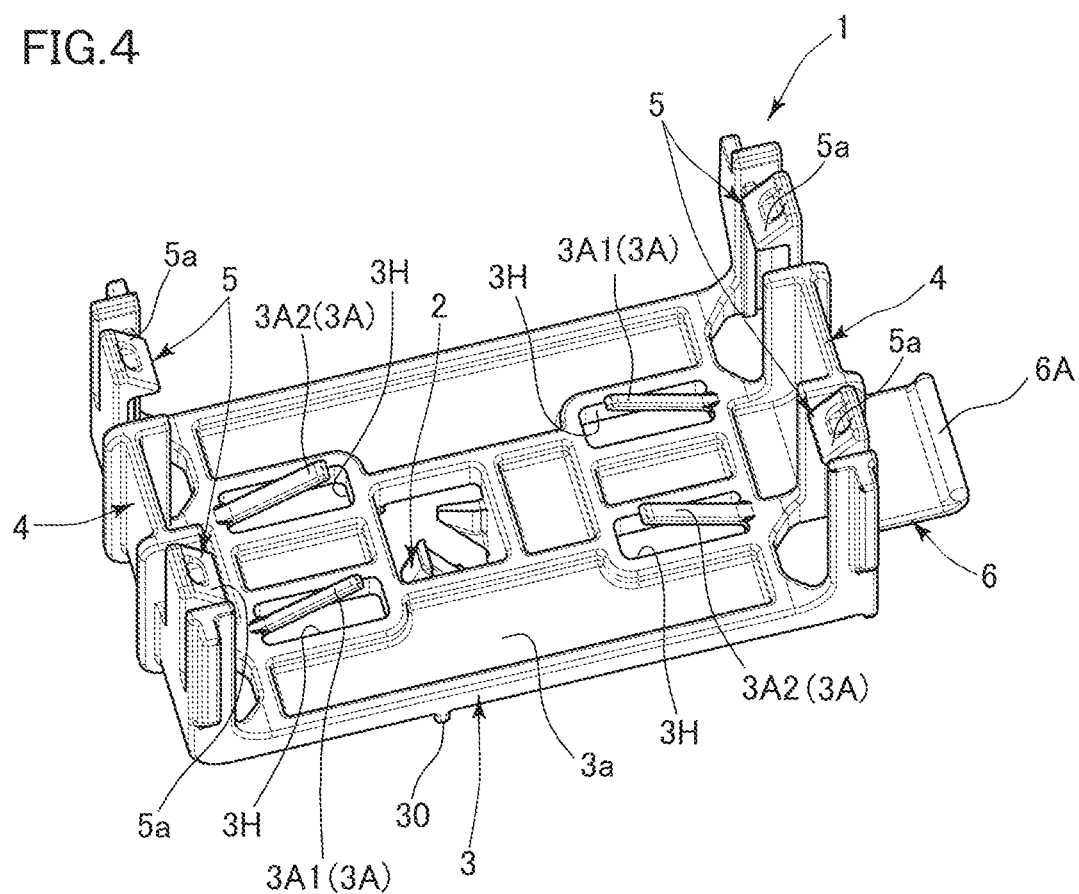
FIG. 4 is a perspective view of the ECU bracket shown in FIG. 1.
Figure 5:
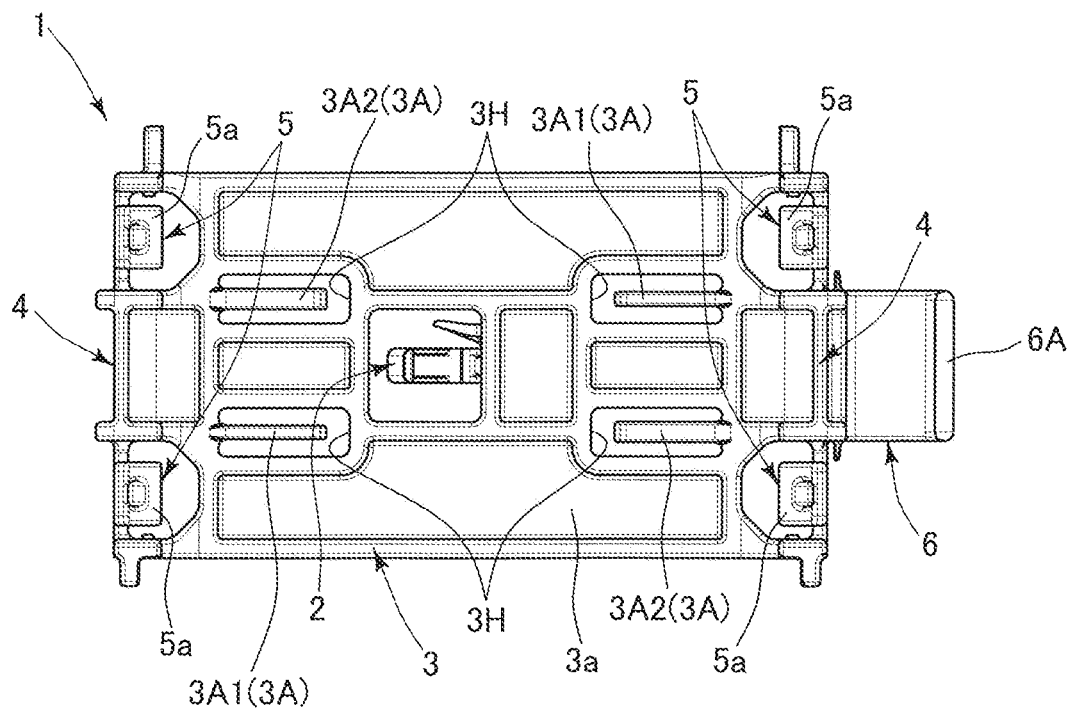
FIG. 5 is a plan view of FIG. 4.
Figure 6:
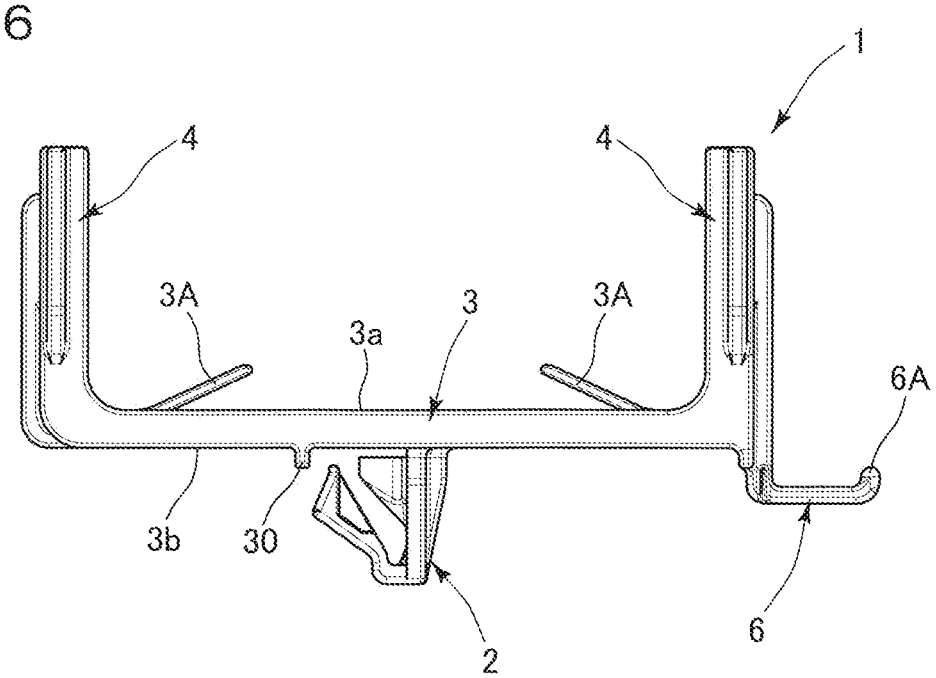
FIG. 6 is a front view of FIG. 4.

In the bottom portion 3, the main front surface 3a is disposed so as to oppose the lower surface 10b side of the electronic control component 10. The plurality of elastic pieces 3A configured to press the lower surface 10b upward are provided on the bottom portion 3. As shown in FIGS. 4 to 6, each of the elastic pieces 3A here extends obliquely upward in a cantilevered manner above a through hole 3H vertically extending through the bottom portion 3, with a peripheral portion of the through hole 3H as the proximal end side, and the elastic piece 3A is configured to be elastically deformable in the vertical direction, with the distal end side of the elastic piece 3A as a free end. When the electronic control component 10 has been assembled to the electronic control component bracket 1, the elastic pieces 3A are maintained in a state in which the elastic pieces 3A constantly press the electronic control component 10 upward by being bent downward (see FIG. 3).

The side wall portions 4, 4 are elastic wall portions whose upper end sides are elastically deformable outward in the opposing direction of the side wall portions 4, 4. As shown in FIGS. 4 to 6, the abutting stop portions 5, 5 are formed so as to protrude inward in the above-described opposing direction from the upper end sides of the side wall portions 4, 4, and have, at the top thereof, inclined surfaces 5a extending downward toward the inner side in the opposing direction. When the electronic control component 10 is assembled, the electronic control component 10 presses the side wall portions 4, 4 apart, outward in the opposing direction of the side wall portions 4, 4 by pressing the inclined surfaces 5a downward, and enters the space between the opposing side wall portions 4, 4. After the entry, the side wall portions 4, 4 are elastically restored, thus bringing about an abutting stop state in which the abutting stop portions 5, 5 abut against the electronic control component 10 from above. The abutting stop portions 5, 5 here abut against the upper surface 10a of the electronic control component 10 from above.

Meanwhile, the plurality of elastic pieces 3A of this embodiment are provided such that, when vibration contained in the traveling vibration of the vehicle is applied in an assembled state in which the electronic control component 10 has been assembled to the electronic control component bracket 1 in a clamped state, the amplitude and the vibration period of at least one elastic piece 3A1 are different from those of the other elastic pieces 3A2.

The elastic pieces 3A2 here are provided so as to have a larger pressing reaction force for pressing the lower surface 10b of the electronic control component 10 than the other elastic pieces 3A1. Specifically, the elastic pieces 3A are composed of two elastic pieces 3A1 and two elastic pieces 3A2, and the plate width of the elastic pieces 3A2 is different from the plate width of the elastic pieces 3A1. This difference in the plate width makes a difference in the pressing reaction force, and hence a difference in one of the amplitude and the vibration period. When projected in a vertical direction Z to a plane orthogonal to the vertical direction Z, the four elastic pieces 3A here are provided, on the plane of projection, with two narrow-width elastic pieces 3A1 in a first diagonal direction and two wide-width elastic pieces 3A2 in a second diagonal direction, relative to the substantially rectangular main front surface 3a (see FIG. 5). It is noted that, although FIG. 5 is not a projection drawing, the elastic pieces 3A are illustrated in a plan view in the same manner as in the case of the plane of projection.

In this manner, by including, among the plurality of elastic pieces 3A, an elastic piece having a different amplitude or a different vibration period when vibration is applied, the electronic control component 10 in the above-described assembled state causes vibration having an undulating configuration (a large amplitude on the elastic piece 3A1 side, and a small amplitude on the elastic piece 3A2 side). However, such an imbalanced support configuration that allows undulation can be considered to be a configuration that varies the frequency bands in which the acceleration (vibration frequency) is increased in the individual elastic pieces 3A. That is, this imbalanced support configuration is a configuration in which the frequency bands in which the acceleration is increased in the individual elastic pieces are dispersed. Accordingly, an excessively large acceleration will not be caused in a specific frequency band by resonance.

Figure 7:
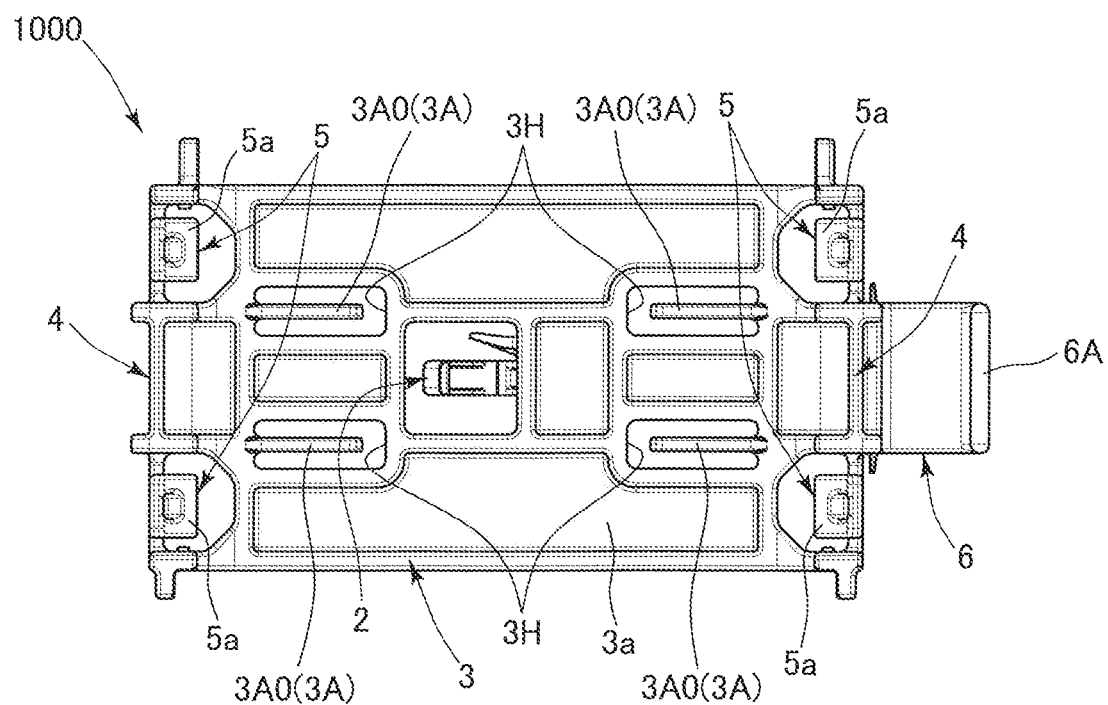
FIG. 7 is a plan view of a conventional ECU bracket.
Figure 8:
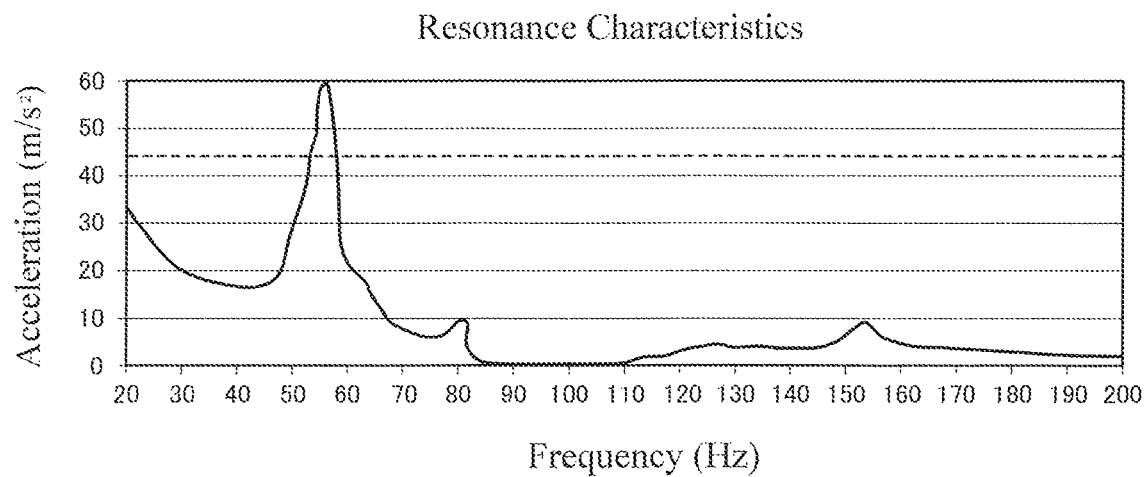
FIG. 8 is an explanatory diagram showing the accelerations of an ECU in various frequency bands when the ECU is assembled to the conventional ECU bracket and vibration is applied to the ECU.
Figure 9:
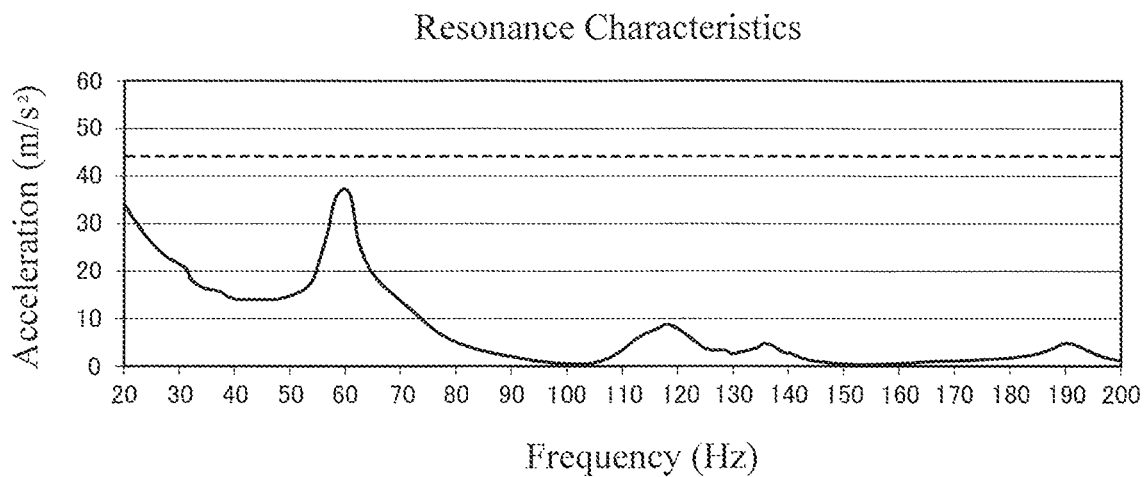
FIG. 9 is an explanatory diagram showing the accelerations of an ECU in various frequency bands when the ECU is assembled to the ECU bracket of this invention and vibration is applied to the ECU.

FIG. 7 shows a conventional electronic control component bracket 1000. The same elements that constitute the above-described embodiment are denoted by the same reference numerals. In the previously described electronic control component bracket 1 (see FIG. 4) of this invention, there is a difference in plate width between the elastic pieces 3A1, 3A2. However, in the electronic control component bracket 1000 shown in FIG. 7, four elastic pieces 3A0 (3A) are the same, all in plate width, plate thickness, plate length, and shape. FIG. 8 shows the result of examining the accelerations at various frequencies in the conventional electronic control component bracket 1000 by attaching an acceleration sensor to a connector portion of the electronic control component 10 and vibrating the electronic control component 10 on a vibration platform. On the other hand, FIG. 9 shows the result of examining the accelerations at various frequencies in the same manner in an assembled state in which the electronic control component 10 has been assembled in a clamped state to the electronic control component bracket 1 of this embodiment. The acceleration peak that is increased in the range from 50 to 60 Hz in FIG. 8 is lowered in FIG. 9. That is, it can be seen that, in this embodiment, the acceleration that is increased at a specific frequency is significantly suppressed than in the case of the conventional electronic control component bracket, and is below a prescribed value (indicated by the broken lines in the drawings).

Although the embodiment of this invention has been described above, the embodiment is merely illustrative, and this invention is not limited thereto. Various modifications such as additions and omissions may be made based on the knowledge of a person skilled in the art without departing from the scope of the claims.

In the following, other embodiments different from the above-described embodiment, and modifications will be described. It is noted that parts having the same functions as those in the above-described embodiment are denoted by the same reference numerals, and the detailed description thereof is omitted. The above-described embodiment and the following examples may be combined to be implemented as appropriate as long as no technical contradiction arises.

Figure 10:
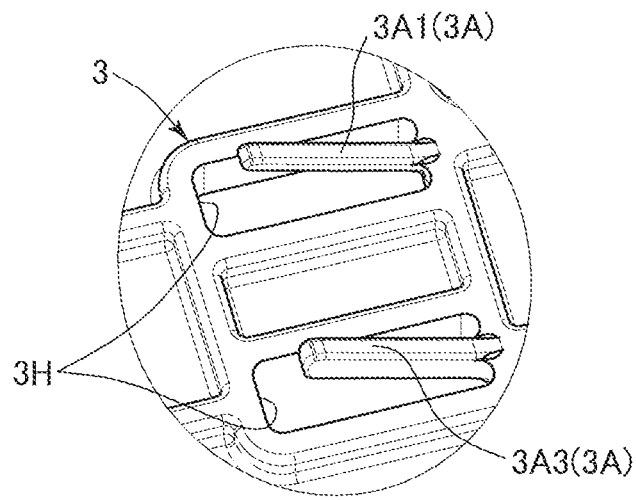
FIG. 10 is an enlarged view showing a first modification of the ECU bracket shown in FIG. 1.
Figure 11:
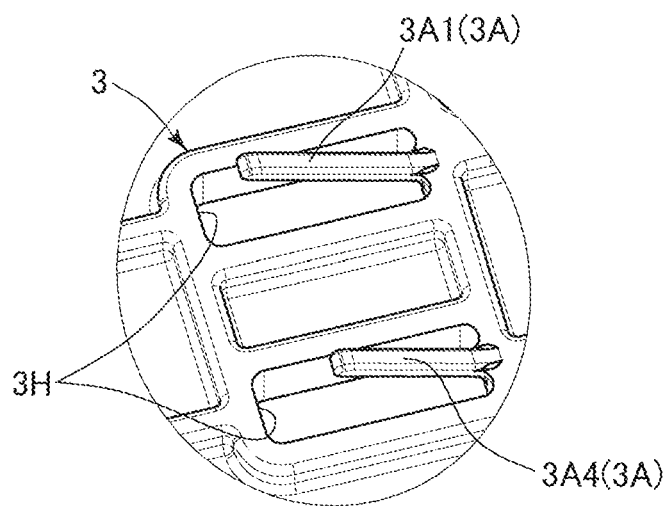
FIG. 11 is an enlarged view showing a second modification of the ECU bracket shown in FIG. 1.
Figure 12:
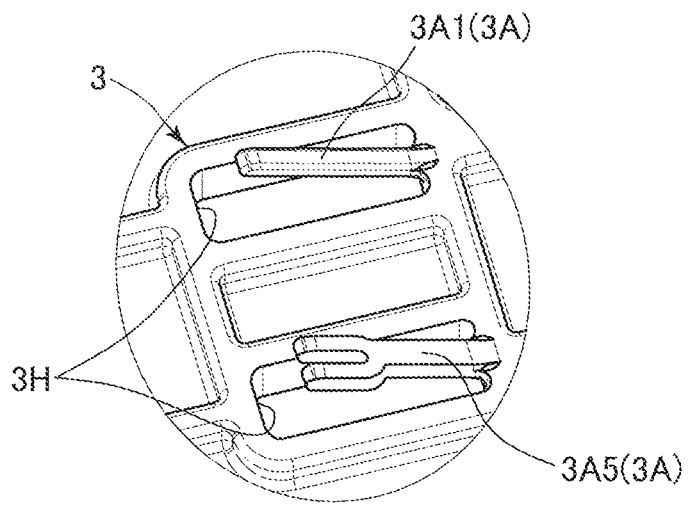
FIG. 12 is an enlarged view showing a third modification of the ECU bracket shown in FIG. 1.

The plurality of elastic pieces 3A in the above-described embodiment include an elastic piece 3A2 having a difference in plate width from at least one elastic piece 3A1. However, as shown in FIGS. 10 to 12, the elastic pieces 3A may be provided such that one or more of the plate width, the plate thickness, the plate length, and the shape of at least one elastic piece 3A1 are different from those of the other elastic pieces 3A3, 3A4, 3A5. Specifically, FIG. 10 shows an example of an elastic piece 3A3 having a plate thickness larger than that of the elastic piece 3A1, FIG. 11 shows an example of an elastic piece 3A4 having a plate length smaller than that of the elastic piece 3A1, and FIG. 12 shows an example of an elastic piece 3A5 having a shape different from that of the elastic piece 3A1.

Figure 13:
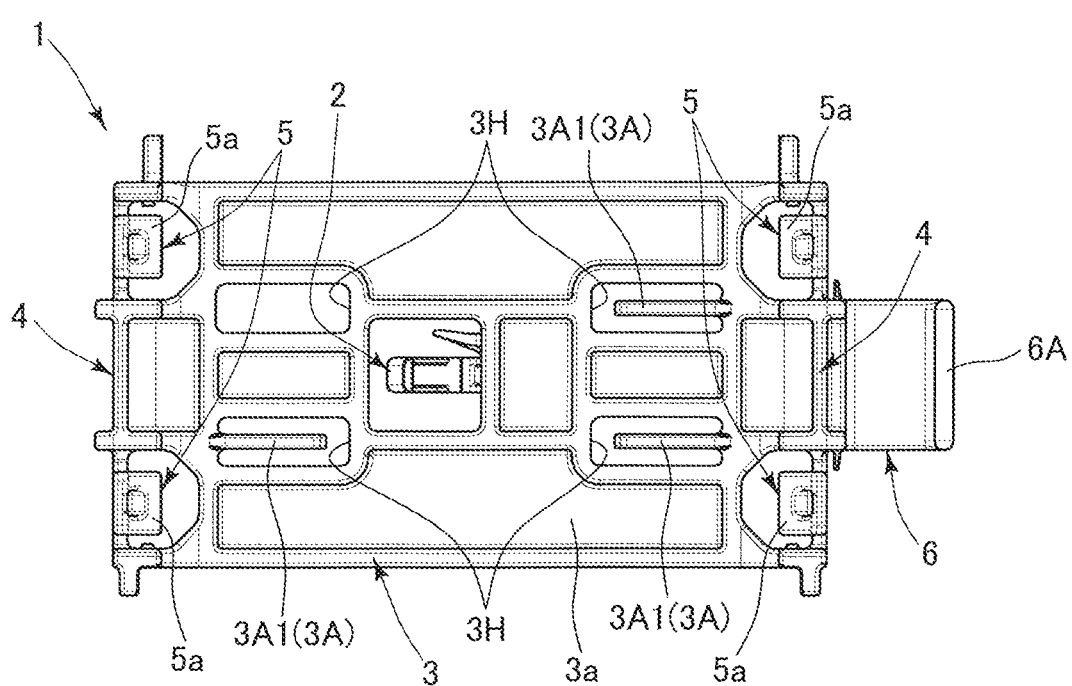
FIG. 13 is a plan view showing a fourth modification of the ECU bracket shown in FIG. 1.

The pressing positions of the plurality of elastic pieces 3A in the above-described embodiment at which the elastic pieces 3A press the lower surface 10b of the electronic control component 10 are arranged such that, when projected in a vertical direction Z relative to a plane orthogonal to the vertical direction Z, the four elastic pieces 3A have rotational symmetry on the plane of projection (see FIG. 5). It is noted that, although FIG. 5 is not a projection drawing, the elastic pieces 3A are illustrated in a plan view in the same manner as in the case of the plane of projection. However, the pressing positions of the plurality of elastic pieces 3A may be dispersed such that the elastic pieces 3A do not have rotational symmetry and/or line symmetry on the above-described plane of projection (see FIG. 13). In this case, even if the plurality of elastic pieces 3A are the same, all in plate width, plate thickness, plate length, and shape, the imbalanced pressing positions make it possible to form a support configuration for the electronic control component 10 that produces undulation, as in the case of the above-described embodiment. Accordingly, it is possible to cause differences in the pressing reaction forces and the amplitudes of the individual elastic pieces 3A, thus reducing the acceleration that is increased at a specific frequency.

DESCRIPTION OF THE REFERENCE CHARACTERS 1 electronic control component bracket
10 electronic control component
10a upper surface of electronic control component
10b lower surface of electronic control component
2 engaging portion
3 bottom portion
3a main front surface of bottom portion
3A elastic piece
4 side wall portion
5 abutting stop portion
5a inclined surface

What is claimed is:

1. An electronic control component bracket for assembling an electronic control component to a vehicle body side, the electronic control component bracket comprising:
  a bottom portion that is to be disposed on a lower surface side of the electronic control component, and on which a plurality of elastic pieces configured to press the lower surface upward are provided; and
  abutting stop portions configured to abut, from above, against the electronic control component that is pressed upward, wherein:
  the electronic control component is clamped between the plurality of elastic pieces and the abutting stop portions so that relative vibration in a vertical direction is not restricted with respect to the electronic control component bracket for the electronic control component in an assembled state, and at least one of the plurality of elastic pieces has a shape that is different than at least one of another of the plurality of elastic pieces, so as to have a different elasticity and in response to vibration encountered in the assembled state, to exhibit an amplitude or vibration period in the vertical direction, of the at least one of the plurality of elastic pieces that is different from a comparable amplitude or vibration period exhibited in the at least one of another of the plurality of elastic pieces in response to vehicle vibration in the vertical direction, thereby suppressing a vertical acceleration peak of the electronic control component with respect to the electronic control component bracket.

2. The electronic control component bracket according to claim 1, wherein:

pressing positions of the plurality of elastic pieces at which the plurality of elastic pieces press the lower surface of the electronic control component are arranged such that, when projected in a vertical direction relative to a plane orthogonal to the vertical direction, the plurality of elastic pieces have rotational symmetry on the plane of projection.

3. The electronic control component bracket according to claim 1, wherein:

the plurality of elastic pieces are provided such that the at least one of the plurality of elastic pieces has a larger pressing reaction force for pressing the lower surface than the at least one of another of the plurality of elastic pieces.

4. An electronic control component bracket for assembling an electronic control component to a vehicle body side, the electronic control component bracket comprising:

a bottom portion that is to be disposed on a lower surface side of the electronic control component, and on which a total of four elastic pieces configured to press the lower surface upward are provided; and abutting stop portions configured to abut, from above, against the electronic control component that is pressed upward, wherein, the electronic control component is clamped between the four elastic pieces and the abutting stop portions so that relative vibration in a vertical direction is not restricted with respect to the electronic control component bracket for the electronic control component in an assembled state, and pressing positions of the four of elastic pieces at which the four of elastic pieces press the lower surface of the electronic control component are arranged such that, when projected in a vertical direction relative to a plane orthogonal to the vertical direction, at corners of a substantially rectangular shape on a plane of projection, and on the plane of projection, with a first two elastic pieces in a first diagonal direction and a second two elastic pieces in a second diagonal direction, one or both of an amplitude and a vibration period, in a vertical direction, of the first two elastic pieces are set to be different from the second two elastic pieces.

* * * * *